(12) United States Patent
Mikasa et al.

(10) Patent No.: US 7,902,592 B2
(45) Date of Patent: Mar. 8, 2011

(54) SEMICONDUCTOR DEVICE AND METHOD FOR MANUFACTURING

(75) Inventors: Yoshihiro Mikasa, Fukushima-Ken (JP);
Takaya Tabuchi, Fukushima-Ken (JP);
Shin Iwase, Fukushima-Ken (JP);
Fumiaki Toyama, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 232 days.

(21) Appl. No.: 12/336,757

(22) Filed: Dec. 17, 2008

(65) Prior Publication Data
US 2009/0315097 A1    Dec. 24, 2009

(30) Foreign Application Priority Data

Dec. 20, 2007    (JP) ................................. 2007-329365

(51) Int. Cl.
*H01L 29/792*    (2006.01)
*H01L 21/336*    (2006.01)
(52) U.S. Cl. .......... 257/324; 257/E29.309; 257/E21.409; 438/261
(58) Field of Classification Search .................. 257/324, 257/E29.309, E21.409; 438/261
See application file for complete search history.

(56) References Cited

U.S. PATENT DOCUMENTS

| 7,352,037 | B2 * | 4/2008 | Kim et al. | 257/401 |
| 2007/0126051 | A1 * | 6/2007 | Kanegae | 257/316 |
| 2008/0128776 | A1 * | 6/2008 | Kim | 257/315 |
| 2008/0290396 | A1 * | 11/2008 | Matsunaga et al. | 257/316 |

* cited by examiner

*Primary Examiner* — Lex Malsawma

(57) ABSTRACT

A semiconductor device and a method for manufacturing the semiconductor device is disclosed. The semiconductor device includes a bit line formed to extend into a semiconductor substrate, a charge storage layer formed on the semiconductor substrate, a word line formed above the charge storage layer to extend across the bit line, a gate electrode formed on the charge storage layer under the word line and between bit lines, a first insulating film formed over the bit line and to extend in the direction of the bit line and a second insulating film that includes a different material than that of the first insulating film and formed to adjoin a side surface of the first insulating film. In addition, the semiconductor device includes an interlayer insulating film that includes a different material from that of the second insulating film that is formed on the first insulating film and the second insulating film and a contact plug coupled to the bit line and formed to penetrate through the first insulating film and the interlayer insulating film and to be sandwiched by the second insulating film.

20 Claims, 16 Drawing Sheets

SEMICONDUCTOR DEVICE AND METHOD FOR MANUFACTURING

RELATED CASES

This Application claims priority to Japanese Patent Application 2007-329365 entitled "Semiconductor Device and Method for Manufacturing Thereof" filed Dec. 20, 2007 which is incorporated herein in its entirety.

TECHNICAL FIELD

The present invention relates to a semiconductor device and a method for manufacturing the same and, more particularly, to a technology to prevent contact plugs from contacting a semiconductor substrate.

BACKGROUND ART

In recent years, non-volatile memories which are semiconductor memory devices which can retain data even when the power supply is turned off have come into wide use. In flash memory, a popular type of non-volatile memory, a transistor which constitutes a memory cell has a so-called charge storage layer of either a floating gate or an insulating film. The charge storage layer accumulates electrical charges, thereby storing data. As a flash memory provided with an insulating film as a charge storage layer, a flash memory in a silicon-oxide-nitride-oxide-silicon (SONOS) structure accumulates electrical charges in a charge storage layer of an oxide-nitride-oxide (ONO) film.

FIG. 1A is a top view of a conventional flash memory device, and FIG. 1B is a cross-sectional view of the flash memory device shown in FIG. 1A taken along the line A-A. In FIG. 1A shows semiconductor substrate 10, a bit line 12, a word line 22 and a contact plug 28 as viewed through an interlayer insulating film 24, a protection film 44. With reference to FIGS. 1A and 1B, the bit line 12 is provided so as to extend into the semiconductor substrate 10. On the semiconductor substrate 10, is provided an ONO film 20 composed of a tunnel insulating film 14, a charge storage layer 16, and a top insulating film 18. On the ONO film 20, a word line 22 is provided to extend across the bit line 12. So as to cover the word line 22, the interlayer insulating film 24 is provided. On the bit line 12, a contact hole 26 penetrating through the interlayer insulating film 24 is provided and, so as to be embedded in the contact hole 26, a contact plug 28 coupled with the bit line 12 is provided. On the interlayer insulating film 24, a wiring layer 42 and the protection film 44 are provided.

In the flash memory device, the bit line 12 is formed by diffusion region, and thus possesses a high resistance. Therefore, in order to electrically couple the bit line 12 with the wiring layer 42, the contact plug 28 is provided on the bit line 12 for every plurality of word lines 22. Japanese Patent Application Publication No. JP-A-2003-297957 discloses a technology to ensure the connection between the contact plug 28 and the bit line 12.

SUMMARY

An object of the present invention is to provide a semiconductor device which allows a contact plug to be prevented from contacting with a semiconductor substrate even when the position of the contact hole is displaced.

In one embodiment, the semiconductor device includes a bit line formed to extend into a semiconductor substrate, a charge storage layer formed on the semiconductor substrate, a word line formed above the charge storage layer to extend across the bit line, a gate electrode formed on the charge storage layer under the word line and between bit lines, a first insulating film formed over the bit line and to extend in the direction of the bit line and a second insulating film that includes a different material than that of the first insulating film and formed to adjoin a side surface of the first insulating film. In addition, the semiconductor device includes an interlayer insulating film that includes a different material from that of the second insulating film that is formed on the first insulating film and the second insulating film and a contact plug coupled to the bit line and formed to penetrate through the first insulating film and the interlayer insulating film and to be sandwiched by the second insulating film.

BRIEF DESCRIPTION OF THE DRAWINGS

The accompanying drawings, which are incorporated in and form a part of this specification, illustrate embodiments and, together with the description, serve to explain the principles of the embodiments.

Figure 14A:
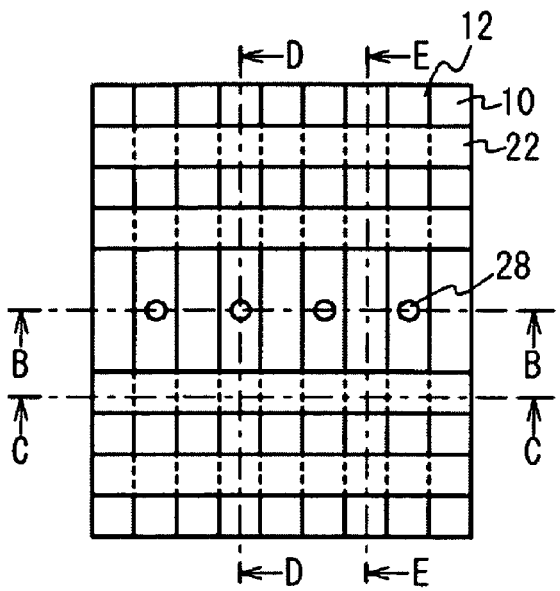
FIG. 14A is a top view of a flash memory of a fourth embodiment of the present invention.
Figure 14D:
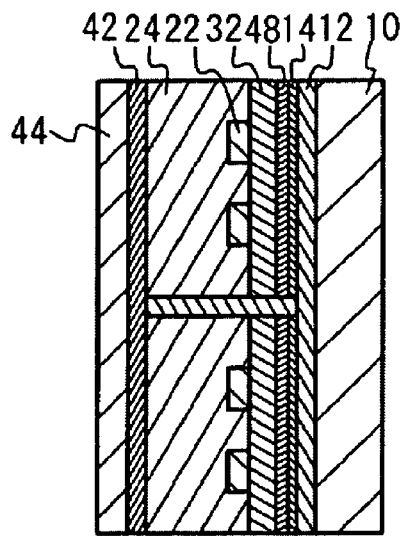
FIG. 14B is a cross-sectional views taken along the lines B-B shown in FIG. 14A.

14C is a cross-sectional views taken along the lines C-C shown in FIG. 14A.

14D is a cross-sectional views taken along the lines C-C shown in FIG. 14A.

Figure 15A:
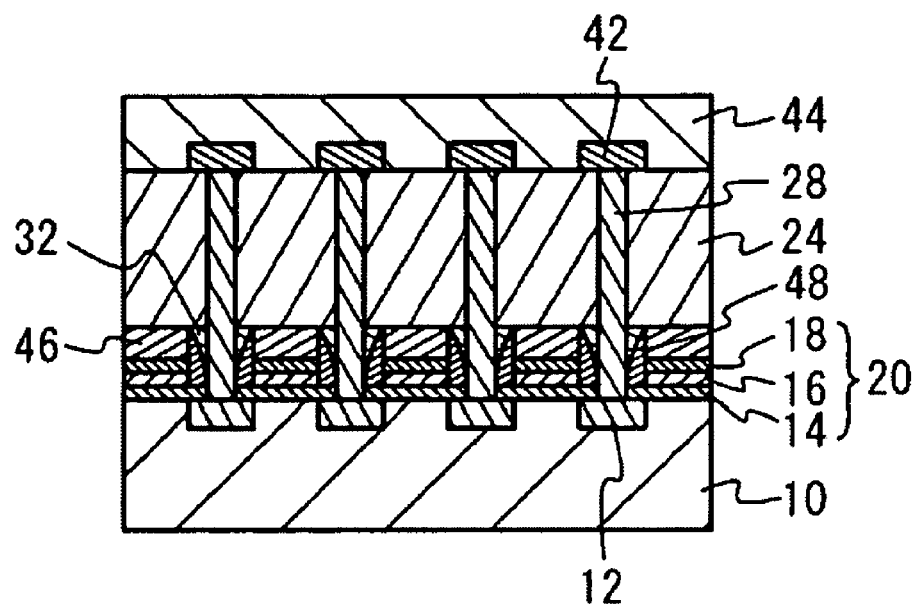

FIG. 15A shows a flash memory of a first modification example of the fourth embodiment.

Figure 15B:
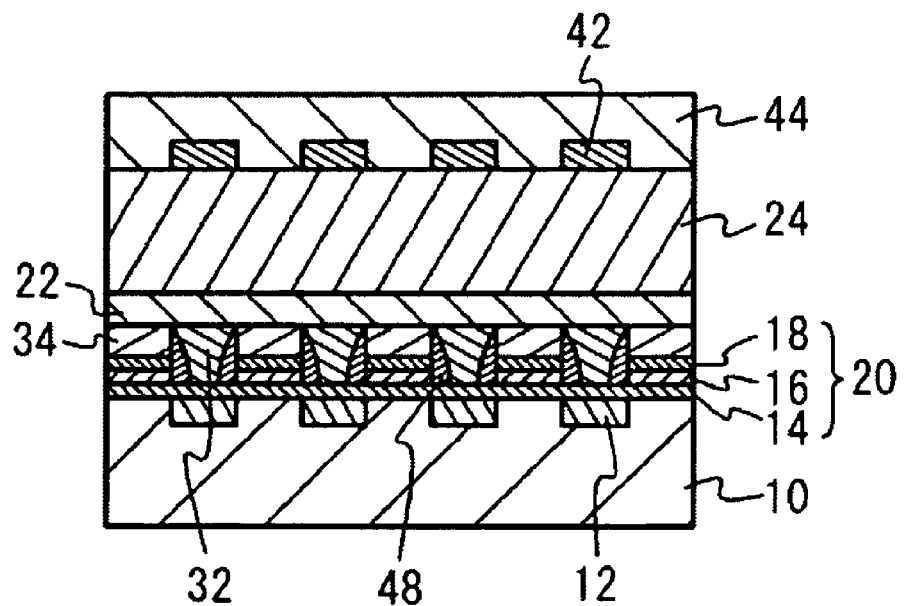

FIG. 15B shows a flash memory of a first modification example of the fourth embodiment.

Figure 16A:
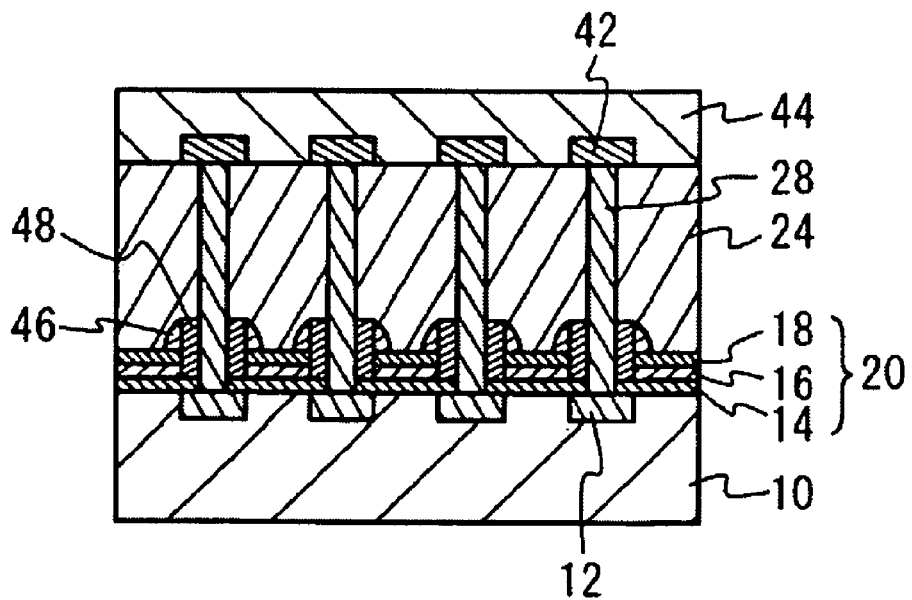

FIG. 16A shows a flash memory of a second modification example of the fourth embodiment.

Figure 16B:
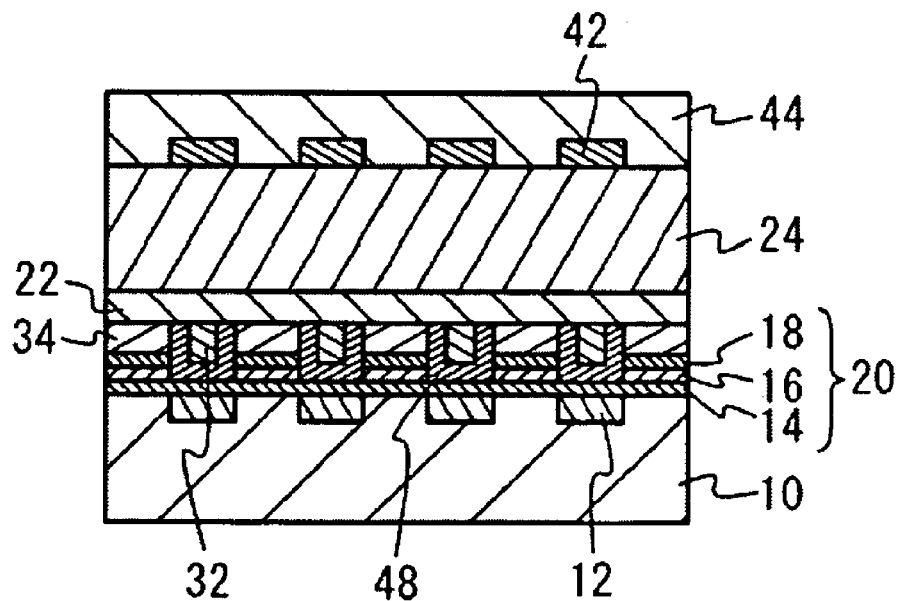

FIG. 16B shows a flash memory of a second modification example of the fourth embodiment.

The drawings referred to in this description should not be understood as being drawn to scale except if specifically noted.

DETAILED DESCRIPTION

Reference will now be made in detail to various embodiments, examples of which are illustrated in the accompanying drawings. While descriptions will be provided in conjunction with these embodiments, it will be understood that the descriptions are not intended to limit the scope of the embodiments. On the contrary, the disclosure is intended to cover alternatives, modifications and equivalents, of these embodiments. Furthermore, in the following description, numerous specific details are set forth in order to provide a thorough understanding of embodiments. In other instances, well-known methods, procedures, components, and circuits have not been described in detail as not to unnecessarily obscure aspects of embodiments.

Figure 1A:
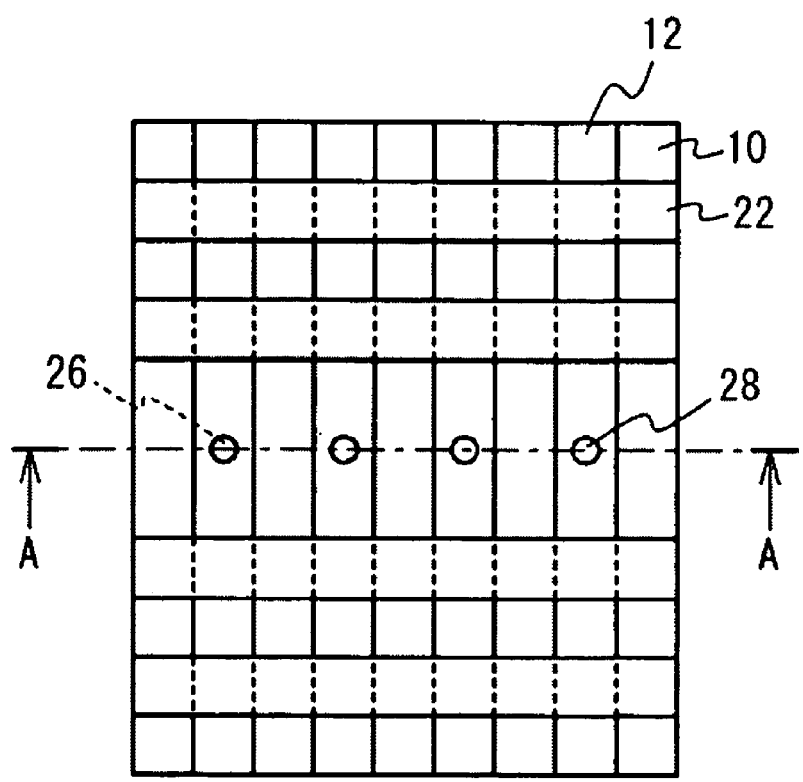
FIG. 1A is a top view of a first example of a conventional flash memory device.
Figure 1B:
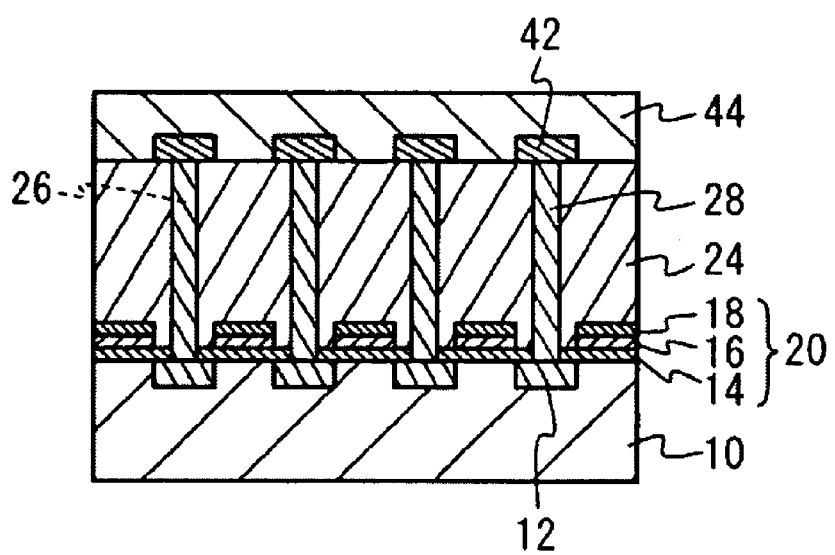
FIG. 1B is a cross-sectional view taken along the line A-A shown in FIG. 1A.

In recent years, the demands for miniaturization and higher integration of memory cells are becoming more prominent. With advancement of miniaturization of memory cells, the width of the bit line 12 shown in FIG. 1A becomes narrower. Therefore, it is difficult to make the diameter of the contact plug 28 formed on the bit line 12 small since the resistance thereof becomes high. Consequently, when forming the contact hole 26, the allowable displacement margin for the position thereof becomes small.

When the position of the contact hole 26 is being formed the contact plug 28 is caused to contact the semiconductor substrate 10 in areas other than where the bit line 12 is formed and the bit line 12 and the semiconductor substrate 10 are short-circuited via the contact plug 28, thereby causing the flash memory to malfunction. Now, embodiments of the present invention that will allow the contact plug to be prevented from contacting with the semiconductor substrate, even when the position of the contact hole that is being formed is displaced, will be described below.

Figure 2A:
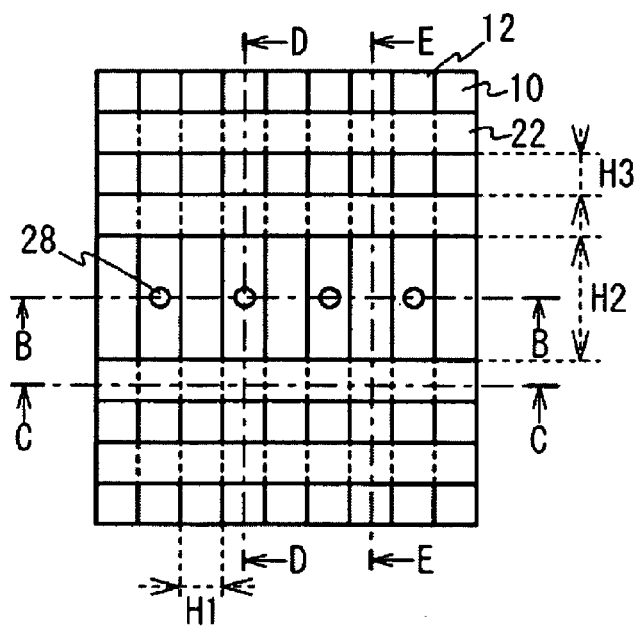
FIG. 2A is a top view of a flash memory of a first embodiment of the present invention.
Figure 7A:
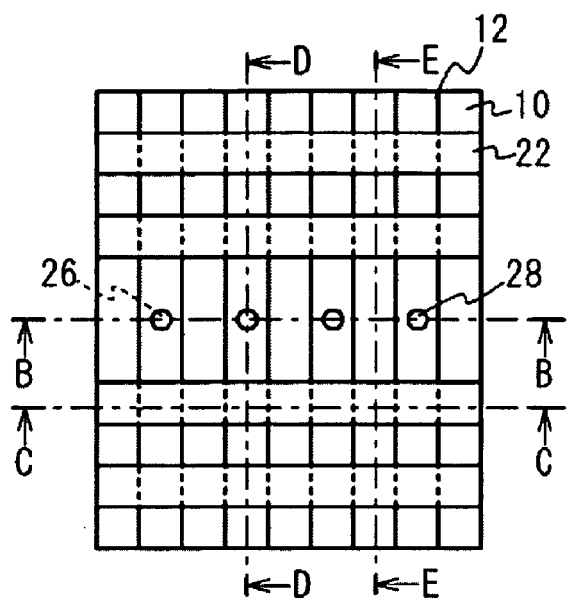
FIG. 7A shows the manufacturing process of the flash memory of the first embodiment.
Figure 7D:
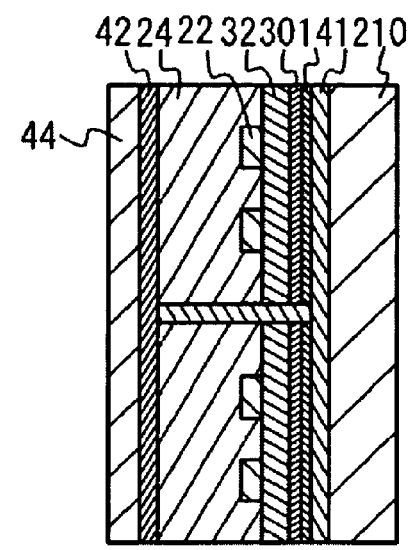
FIG. 7D shows the manufacturing process of the flash memory of the first embodiment.
Figure 7B:
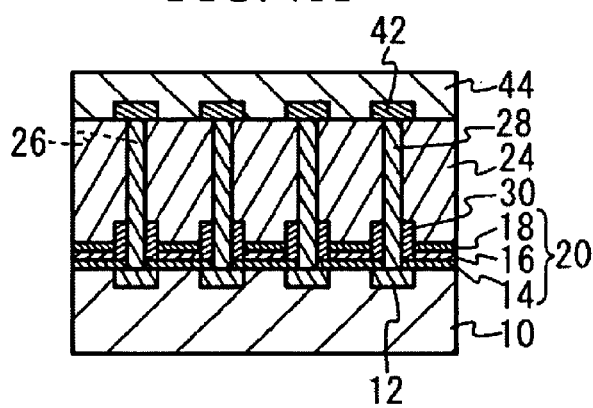
FIG. 7B shows the manufacturing process of the flash memory of the first embodiment.
Figure 7E:
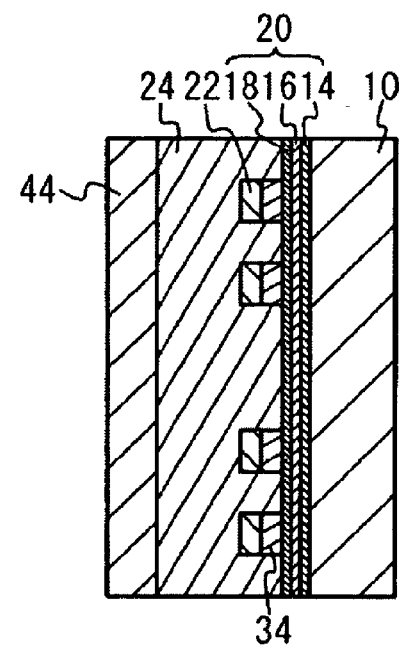
FIG. 7E shows the manufacturing process of the flash memory of the first embodiment.
Figure 7C:
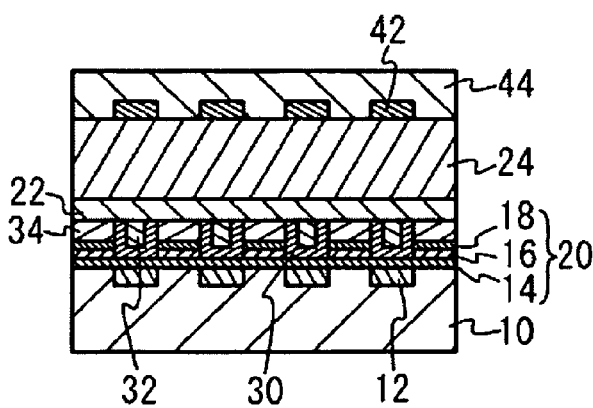
FIG. 7C shows the manufacturing process of the flash memory of the first embodiment.

FIG. 2A is a top view of a flash memory of a first embodiment of the present invention, and FIGS. 2B to 2E are respective cross-sectional views taken along the lines B-B to E-E shown in FIG. 2A. In FIG. 2A, a semiconductor substrate 10, a bit line 12, a word line 22 and a contact plug 28 are shown viewed through an interlayer insulating film 24, a protection film 44 and such, and the same applies to FIGS. 7A, 11A and 14A.

With reference to FIGS. 2A to 2E, the bit line 12 is composed of an n-type diffusion region and is provided so as to extend into the semiconductor substrate 10 which is of a p-type silicon substrate. In one embodiment, the width of the bit line 12 is about 200 nm, and the clearance H1 between the bit lines 12 is about 200 nm. On the semiconductor substrate 10, a tunnel insulating film 14 composed of a silicon oxide film, a charge storage layer 16 composed of a silicon nitride film, and a top insulating film 18 composed of a silicon oxide film are provided in sequence to constitute an ONO film 20. Above the ONO film 20, a word line 22 composed of polysilicon is provided to extend crossing the bit line 12. In one embodiment, the clearance H2 between the word lines 22 in the area where the contact plug 28 is to be formed is about 500 nm, and the clearance H3 between the word lines 22 in other areas is about 100 nm.

Figure 2B:
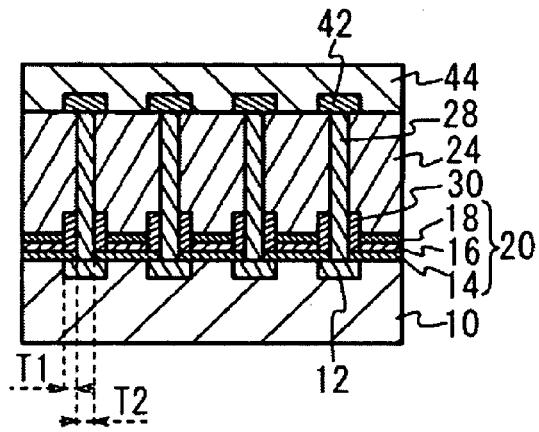
FIG. 2B is a cross-sectional view taken along the lines B-B shown in FIG. 2A.
Figure 2C:
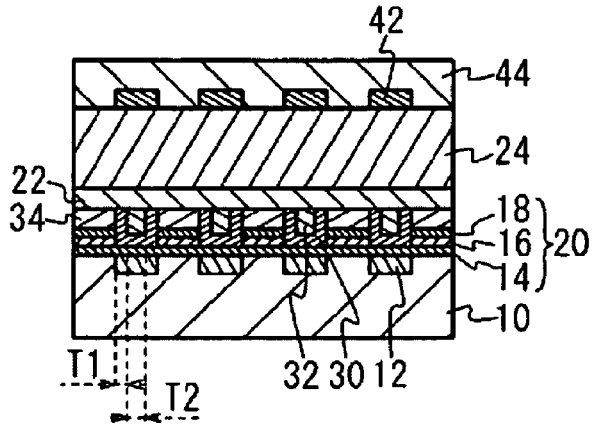
FIG. 2C is a cross-sectional views taken along the lines C-C shown in FIG. 2A.
Figure 2D:
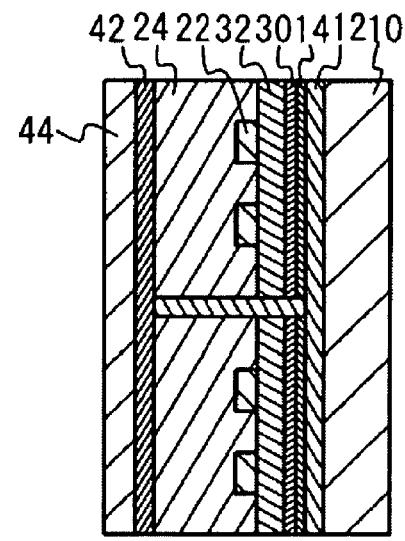
FIG. 2D is a cross-sectional view taken along the lines D-D shown in FIG. 2A.

With reference to FIG. 2C, over the bit line 12, a second insulating film 30 composed of a silicon nitride film having a U-shaped cross-sectional shape is provided to extend in the direction of the bit line 12 with the tunnel insulating film 14 therebetween. In one embodiment, the width T1 of the second insulating film 30 is about 50 nm. A side surface of the second insulating film 30 is disposed above a side surface of the bit line 12. So as to be embedded in the second insulating film 30 of the U-shaped cross-sectional shape, a first insulating film 32 composed of a silicon oxide film is provided.

Figure 2E:
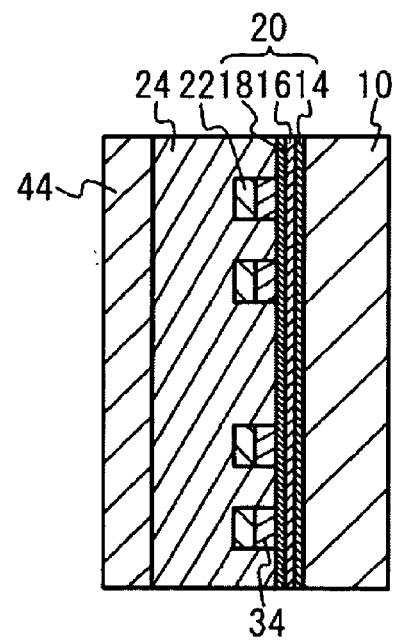
FIG. 2E is a cross-sectional view taken along the lines E-E shown in FIG. 2A.

With reference to FIGS. 2C and 2E, on the ONO film 20, under the word line 22 and in between the bit lines 12, a gate electrode 34 composed of polysilicon is provided. An upper surface of the gate electrode 34, an upper surface of the first insulating film 32, and an upper surface of the second insulating film 30 are planar in structure.

With reference to FIGS. 2B to 2E, so as to cover the word line 22, the gate electrode 34, the first insulating film 32 and the second insulating film 30 and the interlayer insulating film 24 composed of a silicon oxide film is provided. With reference to FIG. 2B, in between the word lines 22 and on the bit line 12, so as to penetrate through the interlayer insulating film 24, the first insulating film 32, a bottom surface of the second insulating film 30, and the tunnel insulating film 14 (sandwiched by the second insulating film 30), the contact plug 28 is provided. In one embodiment, the width T2 of the contact plug 28 is about 100 nm. With reference to FIGS. 2B to 2E, on the interlayer insulating film 24, a wiring layer 42 is provided to extend in the extending direction of the bit line 12. On the wiring layer 42, the protection film 44 is provided. The bit line 12 is electrically coupled with the wiring layer 42 via the contact plug 28.

Figure 3A:
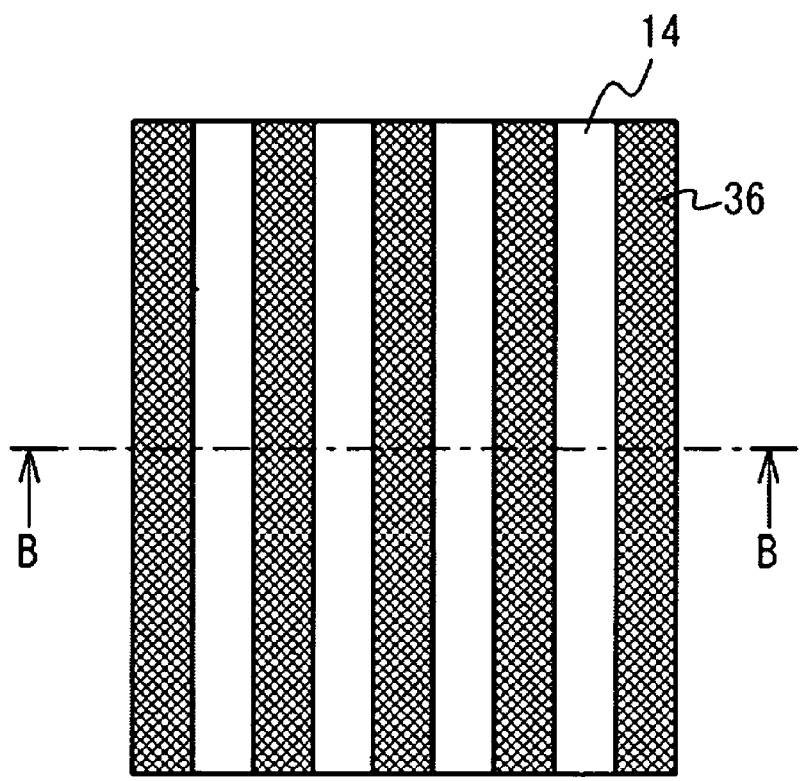
FIG. 3A shows a manufacturing process of the flash memory of the first embodiment.
Figure 3B:
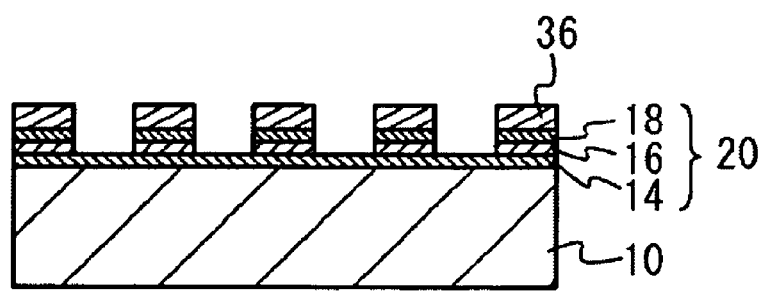
FIG. 3B shows a cross-sectional view taken along the line B-B shown in FIG. 3A.

Next, with reference to FIGS. 3A to 7E, a method for manufacturing the flash memory of the first embodiment will be described. With reference to FIGS. 3A and 3B, on the semiconductor substrate 10 that is a p-type silicon semiconductor substrate, the tunnel insulating film 14 composed of a silicon oxide film, the charge storage layer 16 composed of a silicon nitride film, and the top insulating film 18 composed of a silicon oxide film are formed in sequence to form the ONO film 20. The tunnel insulating film 14 and the top insulating film 18 can be formed using a thermal oxidation method and a chemical vapor deposition (CVD) method, and the charge storage layer 16 can be formed using a CVD method. On the ONO film 20, a first conductive layer 36 composed of polysilicon is formed. The first conductive layer 36 can be formed using a CVD method. With a photoresist, not shown, formed in stripes to extend on the first conductive layer 36 as a mask, using a reactive ion etching (RIE) method, the first conductive layer 36, the top insulating film 18 and the charge storage layer 16 are etched. Consequently, the first conductive layer 36 is formed in stripes so as to extend on the ONO film 20.

Figure 4A:
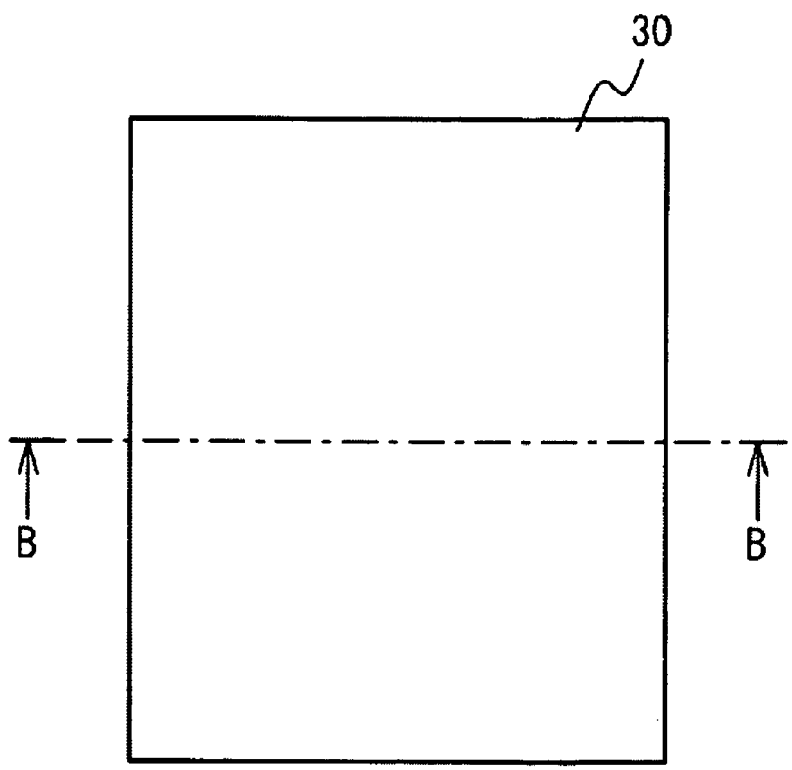
FIG. 4A shows the manufacturing process of the flash memory of the first embodiment.
Figure 4B:
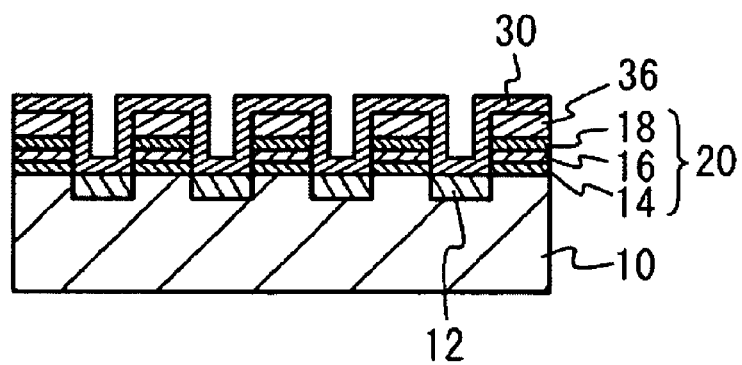
FIG. 4B shows the manufacturing process of the flash memory of the first embodiment.

With reference to FIGS. 4A and 4B, with the first conductive layer 36 as a mask, arsenic is ion implanted into the semiconductor substrate 10. The bit line 12 composed of an n-type diffusion region is formed to extend into the semiconductor substrate 10. So as to cover the first conductive layer 36 formed in stripes, the second insulating film 30 composed of a silicon nitride film is formed using a CVD method. Moreover, the second insulating film 30 is formed along in between the first conductive layers 36.

Figure 5A:
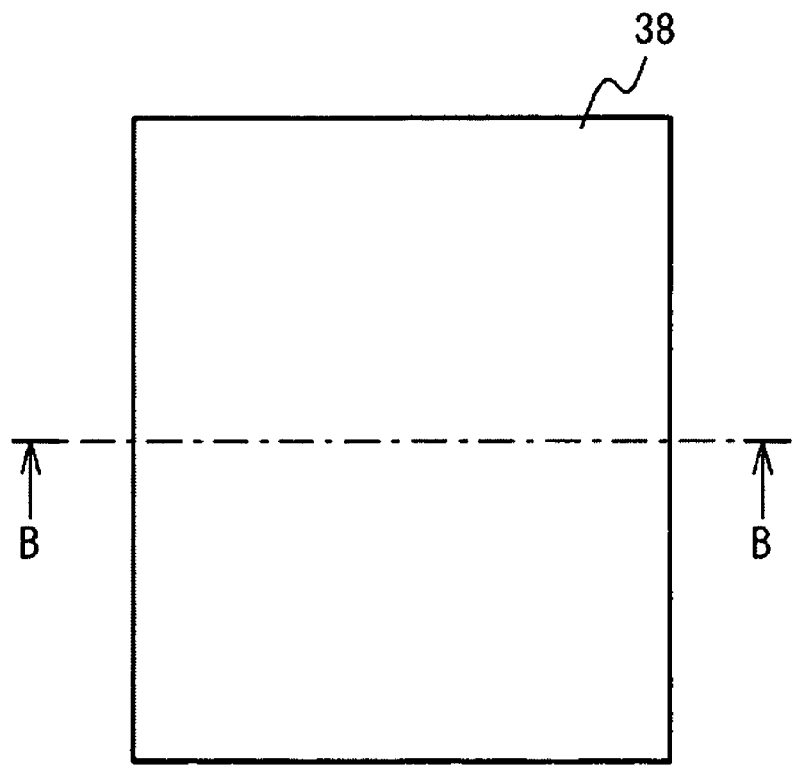
FIG. 5A shows the manufacturing process of the flash memory of the first embodiment.
Figure 5B:
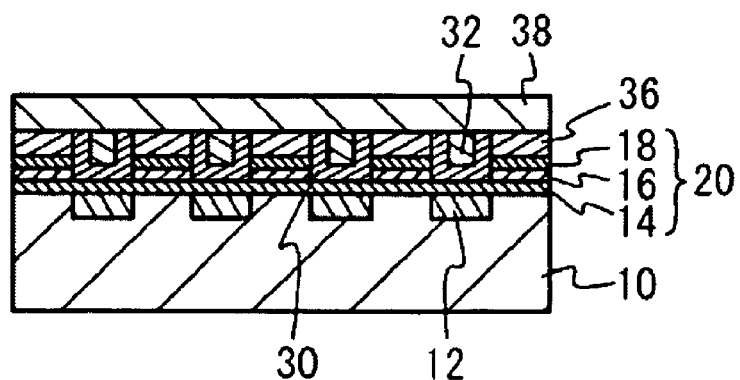
FIG. 5B shows the manufacturing process of the flash memory of the first embodiment.
Figure 6A:
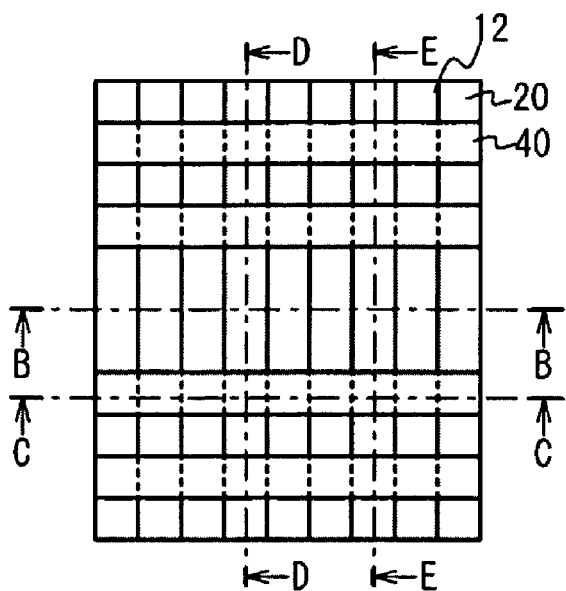
FIG. 6A shows the manufacturing process of the flash memory of the first embodiment.
Figure 6D:
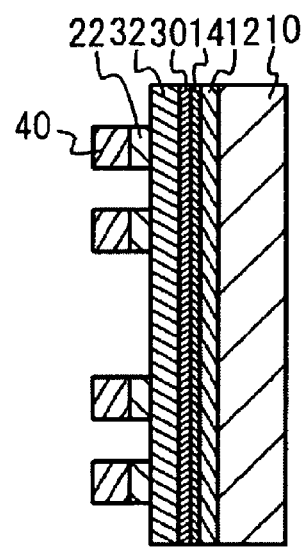
FIG. 6D shows the manufacturing process of the flash memory of the first embodiment.
Figure 6B:
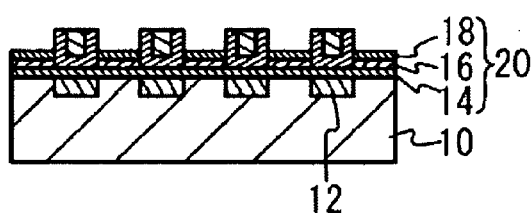
FIG. 6B shows the manufacturing process of the flash memory of the first embodiment.
Figure 6E:
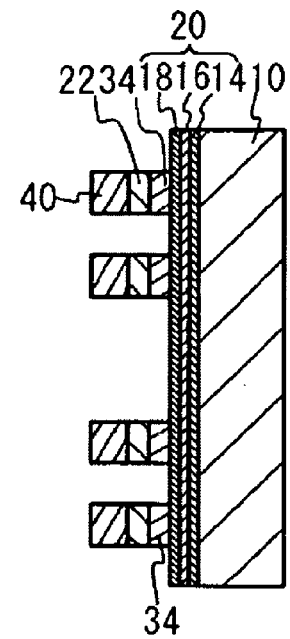
FIG. 6E shows the manufacturing process of the flash memory of the first embodiment.
Figure 6C:
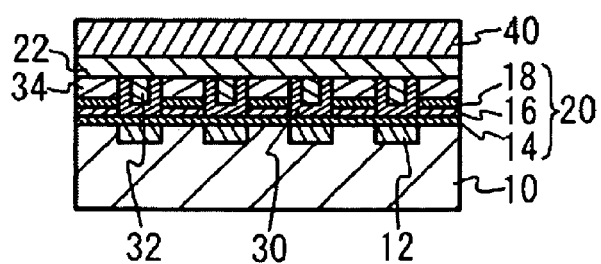
FIG. 6C shows the manufacturing process of the flash memory of the first embodiment.

With reference to FIGS. 5A and 5B, so as to be embedded in between the first conductive layers 36, the first insulating film 32 composed of a silicon oxide film is formed using a high density plasma CVD method. Thereafter, using a chemical mechanical polishing (CMP) method, the first insulating film 32 and the second insulating film 30 are polished so as to expose an upper surface of the first conductive layer 36. Consequently, the upper surface of the first conductive layer 36, the upper surface of the first insulating film 32 and the upper surface of the second insulating film 30 become planar. Further, the second insulating film 30 has a U-shaped cross-sectional shape extending in the extending direction of the bit line 12 over the bit line 12. The first insulating film 32 is formed so as to be embedded in the second insulating film 30 of the U-shaped cross-sectional shape and to extend in the extending direction of the bit line 12 over the bit line 12. Furthermore, the side surface of the second insulating film 30 is disposed above the side surface of the bit line 12. On the first conductive layer 36 and the first insulating film 32, a second conductive layer 38 is formed using a CVD method.

With reference to FIGS. 6A to 6E, on the second conductive layer 38, a mask layer 40 is formed having a pattern to extend crossing the bit line 12. In one embodiment, the mask layer 40 as a mask, the second conductive layer 38 and the first conductive layer 36 are etched using an RIE method. Consequently, a word line 22 composed of the second conductive layer 38 is formed to extend crossing the bit line 12. On the ONO film 20, under the word line 22 and in between the bit lines 12, a gate electrode 34 composed of the first conductive layer 36 is formed.

With reference to FIGS. 7A to 7E, after stripping the mask layer 40, so as to cover the word line 22, the gate electrode 34, the first insulating film 32, the second insulating film 30 and the interlayer insulating film 24 composed of a silicon oxide film is formed. In between the word lines 22 and on the bit line 12, so as to penetrate through the interlayer insulating film 24, the first insulating film 32, the bottom surface of the second insulating film 30 and the tunnel insulating film 14, and to be sandwiched by the second insulating film 30, the contact hole 26 is formed using an RIE method in one embodiment. The contact hole 26 is embedded with tungsten (W) to form the contact plug 28. Consequently, the contact plug 28 is electrically coupled with the bit line 12. On the interlayer insulating film 24, formed is the wiring layer 42 electrically coupled with the contact plug 28 and extending in the extending direction of the bit line 12. So as to cover the wiring layer 42, the protection film 44 is formed. This completes the flash memory of the first embodiment.

Figure 8:
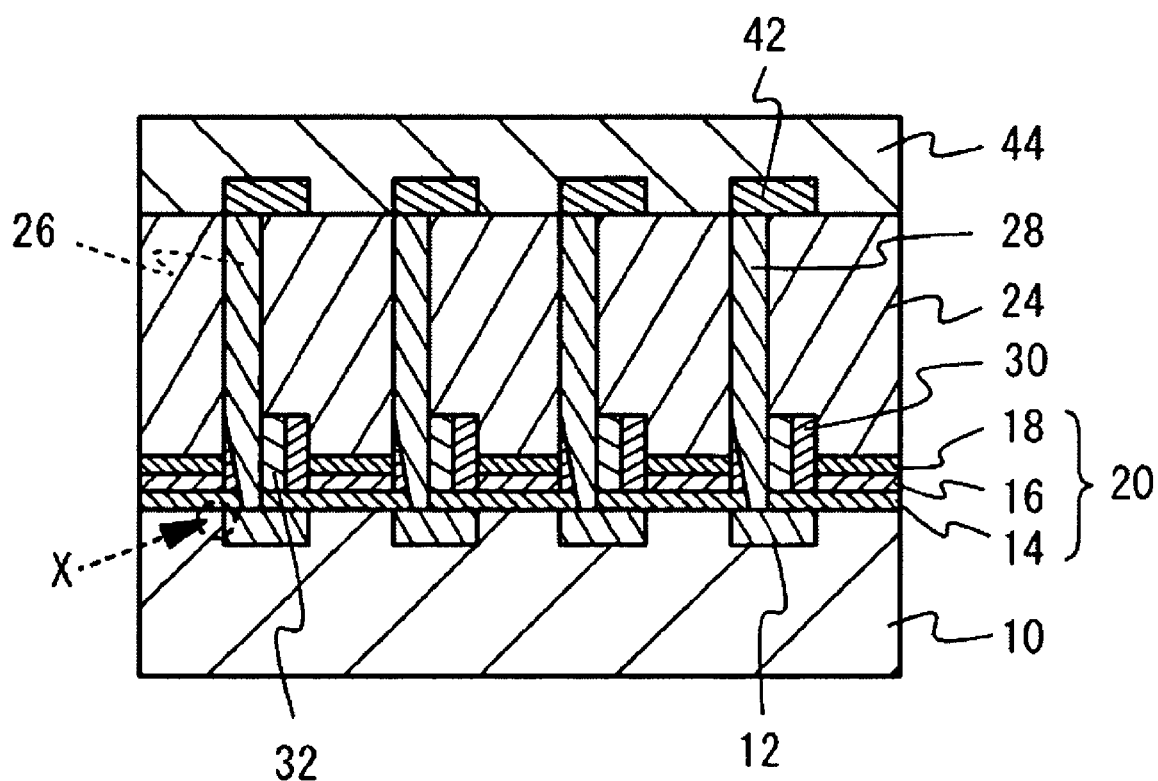
FIG. 8 is a cross-sectional view taken along the line B-B shown in FIG. 2A to illustrate effects of the flash memory of the first embodiment.

According to the first embodiment, as shown in FIGS. 4A and 4B, after the second insulating film 30 is formed between the first conductive layers 36 formed in stripes, as shown in FIGS. 5A and 5B, the first insulating film 32 is formed so as to be embedded in between the first conductive layers 36. Consequently, the second insulating film 30 has the U-shaped cross-sectional shape extending in the extending direction of the bit line 12 over the bit line 12, and the first insulating film 32 is formed so as to be embedded in the second insulating film 30 of the U-shaped cross-sectional shape. The first insulating film 32 and the interlayer insulating film 24 are composed of silicon oxide films, and the second insulating film 30 is composed of a silicon nitride film. Thus, as shown in FIGS. 7A to 7E, in the process of forming the contact hole 26 by etching the first insulating film 32 and the interlayer insulating film 24, the second insulating film 30 that is harder to etch than the first insulating film 32 and the interlayer insulating film 24 is formed adjoining the side surface of the first insulating film 32. Therefore, even when the position of the contact hole 26 is formed displaced, because the second insulating film 30 is formed, as shown in FIG. 8, the contact plug 28 which is formed by embedding the contact hole 26 can be prevented from contacting the semiconductor substrate 10 in lateral to the bit line 12 (area marked X). Consequently, the semiconductor device can be prevented from malfunctioning.

In addition, according to the first embodiment, as shown in FIGS. 3A and 3B, the first conductive layer 36 is formed to extend on the ONO film 20 and, as shown in FIGS. 4A and 4B, with the first conductive layer 36 as a mask, the bit line 12 is formed to extend into the semiconductor substrate 10. Thereafter, as shown in FIGS. 5A and 5B, on the first conductive layer 36 and the first insulating film 32, the second conductive layer 38 is formed. As shown in FIGS. 6A to 6E, with the mask layer 40 formed on the second conductive layer 38 to extend crossing the bit line 12 as a mask, the second conductive layer 38 and the first conductive layer 36 are etched to form the word line 22 composed of the second conductive layer 38 and the gate electrode 34 composed of the first conductive layer 36. Consequently, the gate electrode 34 can be formed in a self-aligning manner to the bit line 12.

While the first embodiment illustrates the first insulating film 32 and the interlayer insulating film 24 being composed of silicon oxide films and the second insulating film 30 being composed of a silicon nitride film, it is not limited as such. In the process of forming the contact hole 26, the second insulating film 30 may be composed of a different material from the first insulating film 32 and the interlayer insulating film 24 which may be harder to etch than the first insulating film 32 and the interlayer insulating film 24. In this case, when the position of the contact hole 26 is formed displaced, the contact plug 28 can also be prevented from contacting with the semiconductor substrate 10.

Figure 9A:
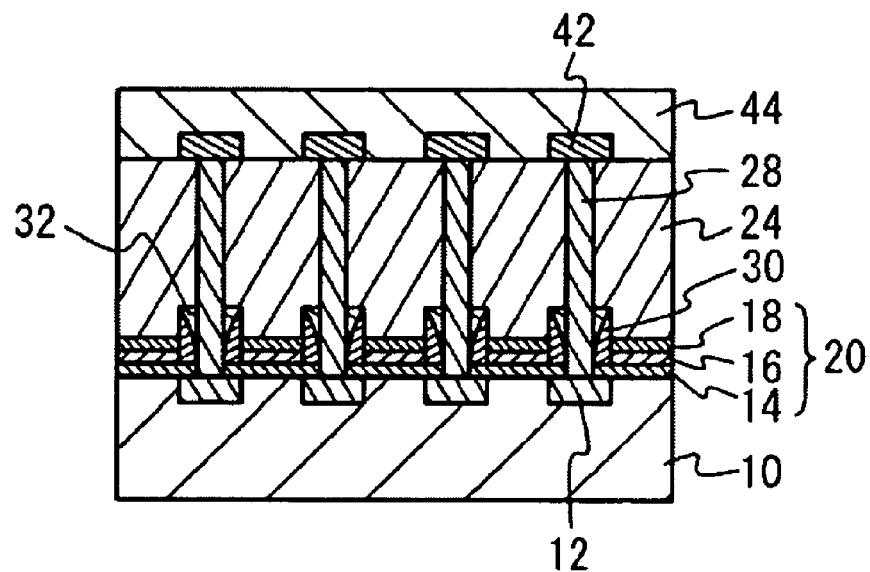
FIG. 9A shows a flash memory of a first modification example of the first embodiment.
Figure 9B:
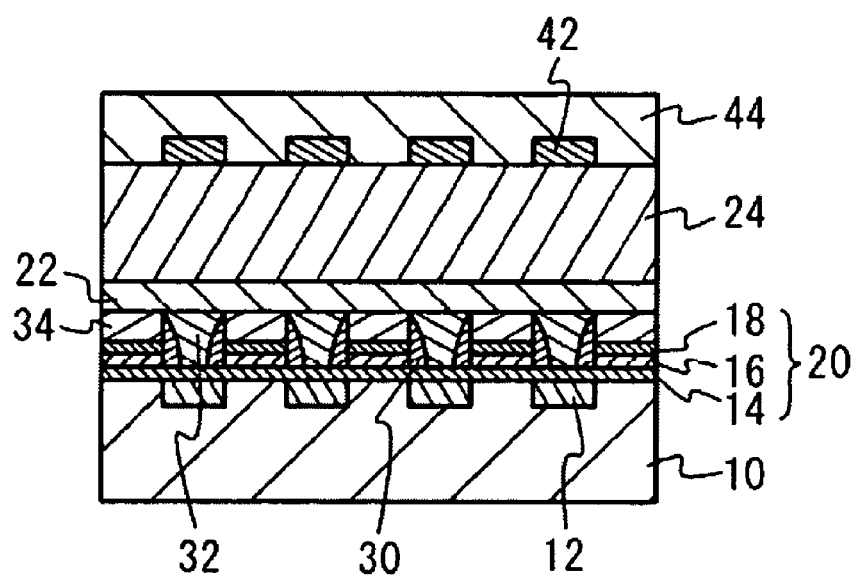
FIG. 9B shows a flash memory of a first modification example of the first embodiment.

Furthermore, while the first embodiment illustrates the second insulating film 30 being extended in the extending direction of the bit line 12 over the bit line 12, and having the U-shaped cross-sectional shape, it is not limited as such. For example, as in the case of a first modification example of the first embodiment shown in FIGS. 9A and 9B, the second insulating film 30 may be provided over the bit line 12 to extend in the extending direction of the bit line 12 and on the side surface of the first insulating film 32. In this case, when the position of the contact hole 26 is formed displaced, the contact plug 28 can also be prevented from contacting the semiconductor substrate 10. In addition, the second insulating film 30 shown in FIGS. 9A and 9B may be formed, after the second insulating film 30 is formed so as to cover the first conductive layer 36 shown in FIGS. 4A and 4B, by etching back the second insulating film 30.

Figure 10A:
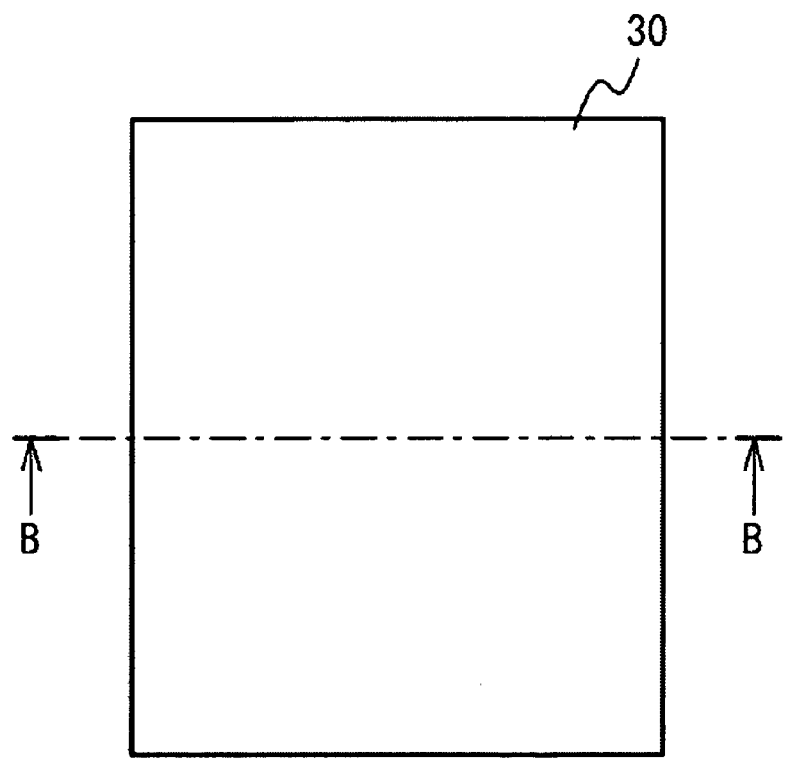
FIG. 10A shows a manufacturing process of a flash memory of a second embodiment of the present invention.
Figure 10B:
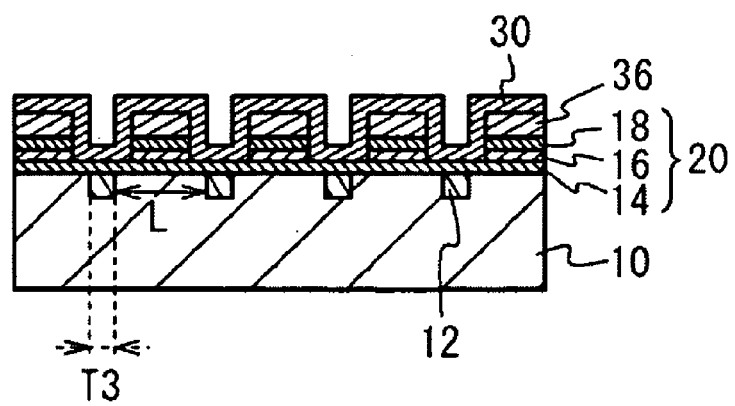
FIG. 10B shows a manufacturing process of a flash memory of a second embodiment of the present invention.

A second embodiment of the present invention is an embodiment of forming the bit line 12 with the first conductive layer 36 as a mask after the second insulating film 30 is formed along in between the first conductive layers 36. With reference to FIGS. 10A and 10B, after the processes described with reference to FIGS. 3A and 3B of the first embodiment are carried out to form the first conductive layer 36 to extend, the second insulating film 30 is formed so as to cover the first conductive layer 36. With the first conductive layer 36 as a mask, the bit line 12 is formed in the semiconductor substrate 10. Thereafter, the processes described with reference to FIGS. 5A to 7B of the first embodiment are carried out.

According to the second embodiment, as shown in FIGS. 10A and 10B, the bit line 12 is formed after the second insulating film 30 is formed so as to cover the first conductive layer 36. According to this embodiment, by the second insulating film 30 formed on the side surface of the first conductive layer 36, the implanted region formed by ion implanting an impurity, i.e. arsenic, in the semiconductor substrate 10 can be made narrow. Therefore, even when the impurity is ion implanted in the semiconductor substrate 10 at high energy, the implanted region can be prevented from diffusing in a width direction of the bit line 12 by heat. Accordingly, the ion implanting of the impurity in the semiconductor substrate 10 can be carried out at high energy, thereby making the impurity concentration of the diffusion region high. Therefore, the resistance of the bit line 12 that is the diffusion region can be lowered. Further, since ion implanting of an impurity into the first conductive layer 36 is carried out at high energy, typically, ion implanting of an impurity into the semiconductor substrate 10 is carried out separately. This is because of the concern of the implanted region formed in the semiconductor substrate 10 being diffused in the width direction of the bit line 12 by heat. However, according to the second embodiment, the implanted region can be prevented from diffusing in the width direction of the bit line 12 by heat. Consequently, ion implanting of an impurity into the first conductive layer 36 and ion implanting of an impurity into the semiconductor substrate 10 can be carried out at the same time, thereby reducing the number of manufacturing processes. Furthermore, according to the second embodiment, the width T3 of the bit line 12 can be made finer compared with that of the first embodiment, thus the channel length L that is the clearance between the bit lines 12 can be made longer.

Figure 11A:
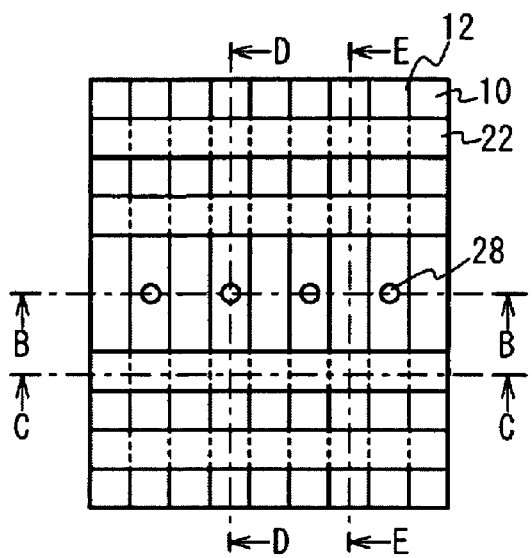
FIG. 11A is a top view of a flash memory of a third embodiment of the present invention.
Figure 11D:
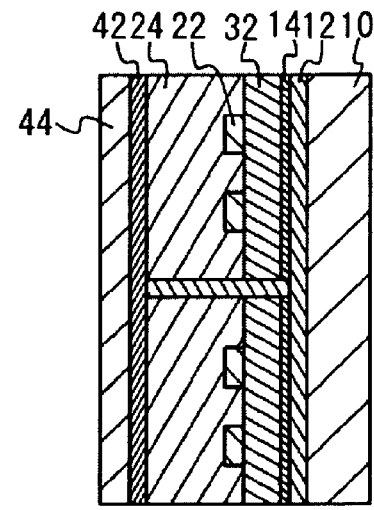
FIG. 11D is a cross-sectional views taken along the lines D-D shown in FIG. 11A.

A third embodiment of the present invention is an embodiment of the second insulating film 30 being formed in between the word lines 22 and in between the first insulating films 32. FIG. 11A is a top view of a flash memory of the third embodiment, and FIGS. 11B to 11E are respective cross-sectional views taken along the lines B-B to E-E shown in FIG. 11A.

Figure 11B:
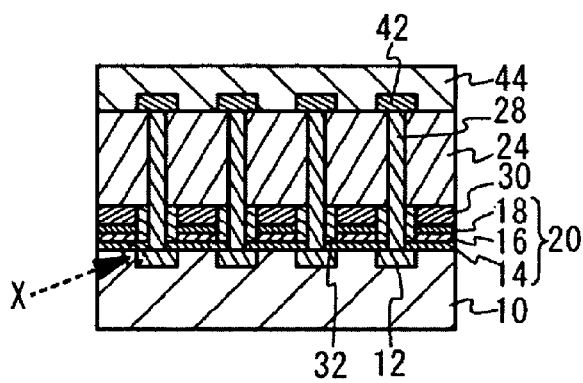
FIG. 11B is a cross-sectional views taken along the lines B-B shown in FIG. 11A.
Figure 11E:
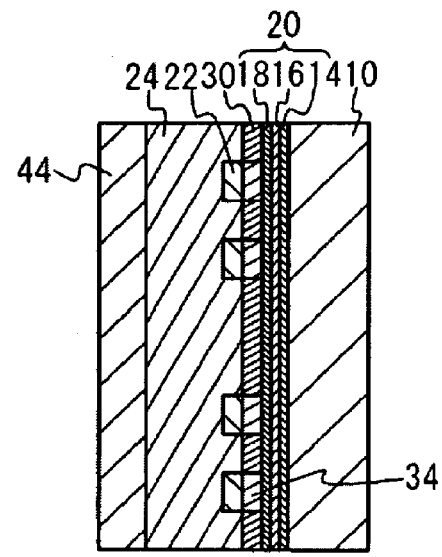
FIG. 11E is a cross-sectional views taken along the lines E-E shown in FIG. 11A.
Figure 11C:
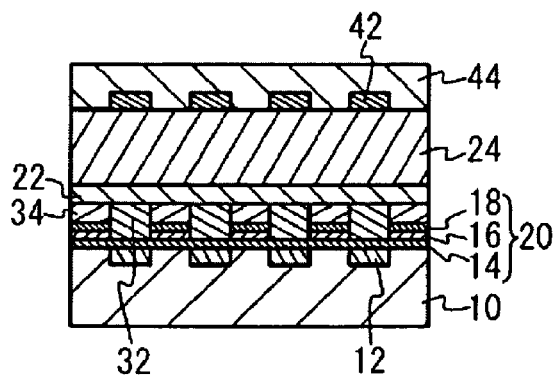
FIG. 11C is a cross-sectional views taken along the lines C-C shown in FIG. 11A.

With reference to FIGS. 11B and 11E, the second insulating film 30 is provided on the ONO film 20 in between the word lines 22 and in between the first insulating films 32. With reference to FIGS. 11B and 11C, the first insulating film 32 is provided over the bit line 12 with the tunnel insulating film 14 therebetween, and the side surface of the first insulating film 32 is adjoining to the side surface of the second insulating film 30. Further, the side surface of the second insulating film 30 is being disposed above the side surface of the bit line 12. Other structures are the same as those of the first embodiment and shown in FIGS. 2A to 2E, thus the description thereof are omitted.

Figure 12A:
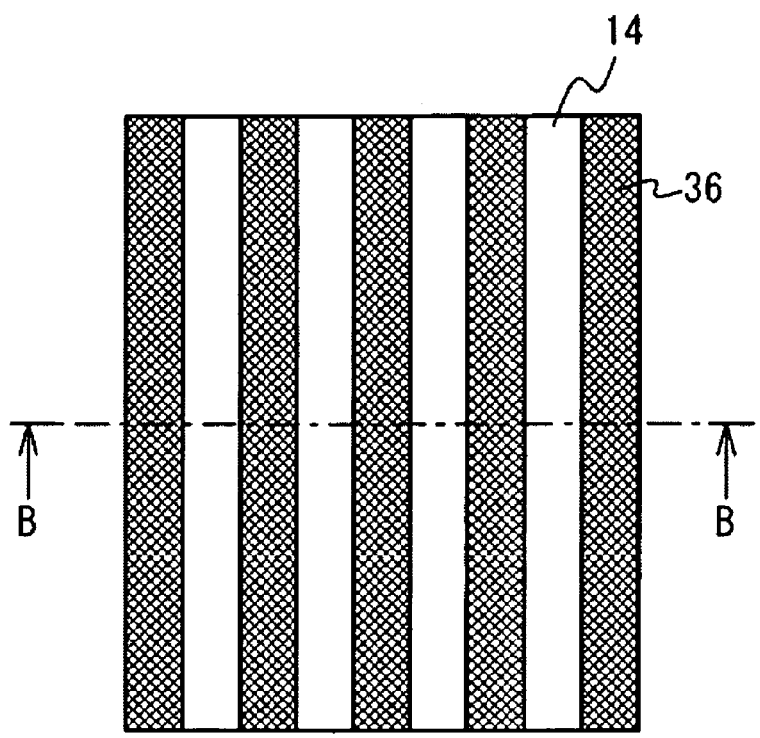
FIG. 12A shows a manufacturing process of the flash memory of the third embodiment.
Figure 12B:
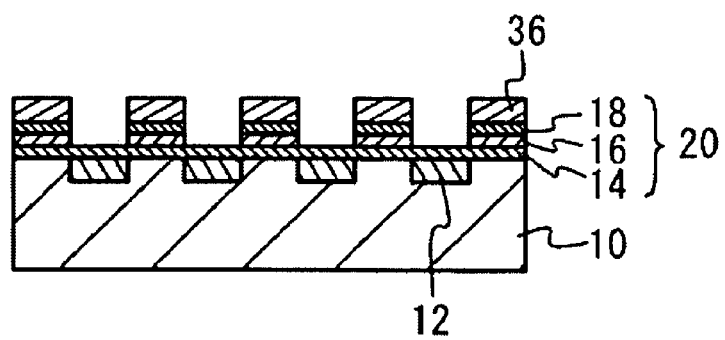
FIG. 12B shows a cross-sectional view taken along the line B-B shown in FIG. 12A.
Figure 13A:
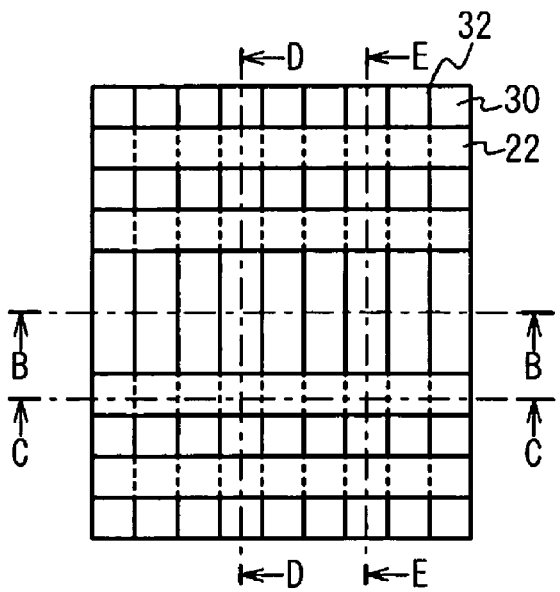
FIG. 13A shows the manufacturing process of the flash memory of the third embodiment.
Figure 13B:
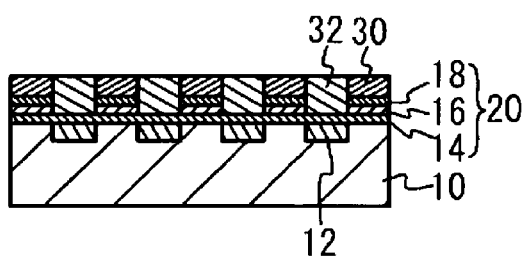
FIG. 13B is a cross-sectional view taken along the lines B-B shown in FIG. 13A.
Figure 13C:
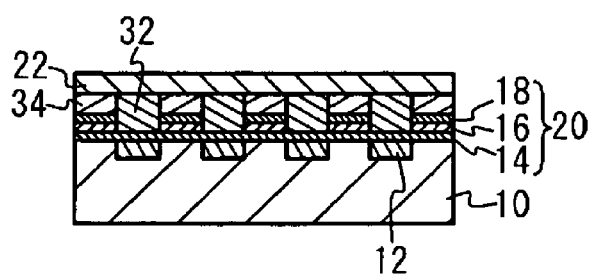
FIG. 13C is a cross-sectional view taken along the lines C-C shown in FIG. 13A.
Figure 13D:
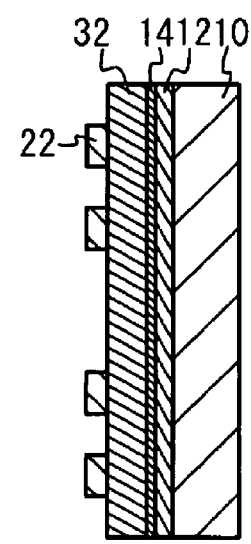
FIG. 13D is a cross-sectional view taken along the lines D-D shown in FIG. 13A.
Figure 13E:
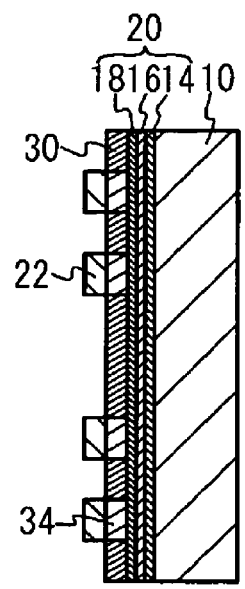
FIG. 13E is a cross-sectional view taken along the lines D-D shown in FIG. 13A.

Next, with reference to FIGS. 12A to 13E, a method for manufacturing the flash memory of the third embodiment will be described. With reference to FIGS. 12A and 12B, the processes described with reference to FIGS. 3A and 3B of the first embodiment are carried out to form the first conductive layer 36 to and, thereafter, with the first conductive layer 36 as a mask, arsenic is ion implanted into the semiconductor substrate 10. Consequently, the bit line 12 composed of an n-type diffusion region to extend into the semiconductor substrate 10 is formed.

With reference to FIGS. 13A to 13E, so as to be embedded in between the first conductive layers 36, the first insulating film 32 composed of a silicon oxide film is formed. On the first insulating film 32 and on the first conductive layer 36, formed is the second conductive layer 38. With the mask layer 40 formed on the second conductive layer 38 as a mask, etching is carried out to form the word line 22 composed of the second conductive layer 38 and, under the word line 22, the gate electrode 34 composed of the first conductive layer 36. In one embodiment, after stripping the mask layer 40, so as to cover the first insulating film 32 formed between the word lines 22, the second insulating film 30 composed of a silicon nitride film is formed using a CVD method. In this case, it is preferable that the film thickness of the second insulating film 30 is about 100 to 200 nm. Thereafter, the second insulating film 30 is etched back to expose the upper surface of the first insulating film 32. Consequently, on the ONO film 20, in between the word lines 22 and in between the first insulating films 32, the second insulating film 30 is formed of the same height as the first insulating film 32 and the gate electrode 34. Further, the side surface of the second insulating film 30 is being disposed above the side surface of the bit line 12. Thereafter, the interlayer insulating film 24, the contact plug 28, the wiring layer 42 and the protection film 44 are formed to complete the flash memory of the third embodiment.

According to the third embodiment, as shown in FIGS. 13A to 13E, the gate electrode 34 and the word line 22 are formed by etching the first conductive layer 36 and the second conductive layer 38 and, thereafter, on the ONO film 20, in between the word lines 22 and in between the first insulating films 32, the second insulating film 30 is formed. Consequently, the second insulating film 30 is formed to adjoin to the side surface of the first insulating film 32. Further, the side surface of the second insulating film 30 is disposed above the side surface of the bit line 12. Consequently, even when the position of the contact hole 26 is being formed displaced, the contact plug 28 can be prevented from contacting the semiconductor substrate 10.

In particular, in the first embodiment, because the second insulating film 30 is formed over the bit line 12, when the contact hole 26 is formed largely displaced running off the bit line 12, the contact plug 28 may make contact with the semiconductor substrate 10. However, according to the third embodiment, the second insulating film 30 is provided in between the first insulating films 32, more specifically, in between the bit lines 12. Consequently, even when the contact hole 26 is formed largely displaced running off the bit line 12, the contact plug 28 can be prevented from contacting the semiconductor substrate 10.

In a fourth embodiment of the present invention the second insulating film 30 is composed of a third insulating film provided on the ONO film 20 in between the word lines 22 and in between the first insulating films 32 and a fourth insulating film provided over the bit line 12 having a U-shaped cross-sectional shape. FIG. 14A is a top view of a flash memory of the fourth embodiment, and FIGS. 14B to 14E are respective cross-sectional views taken along the lines B-B to E-E shown in FIG. 14A.

Figure 14B:
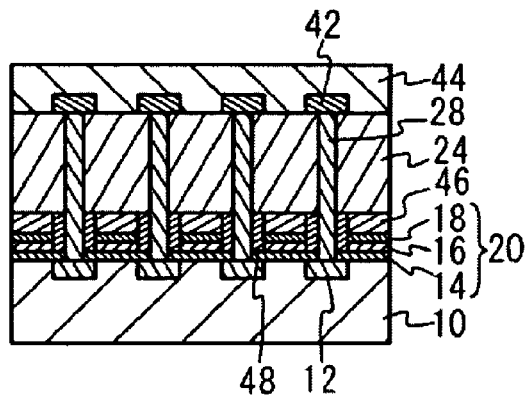
Figure 14E:
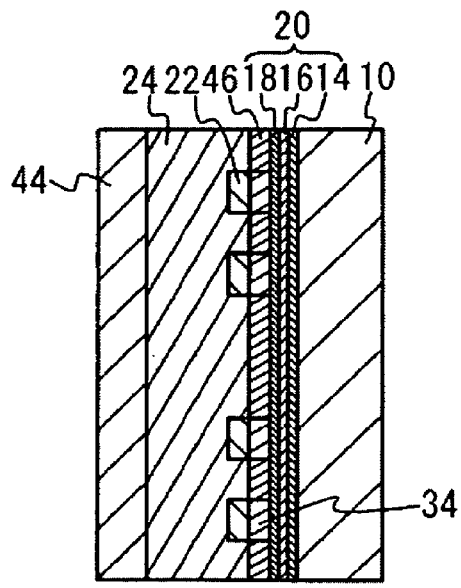
Figure 14C:
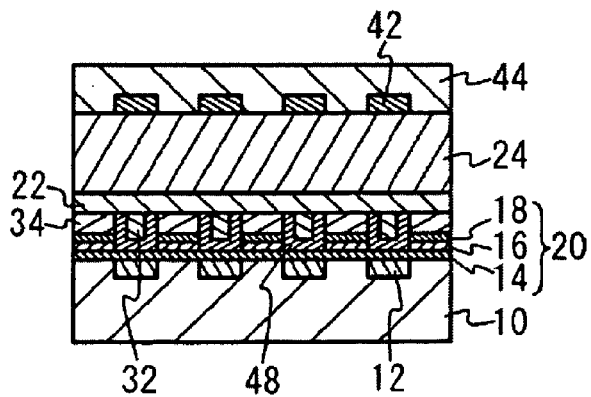

With reference to FIGS. 14B and 14E, on the ONO film 20, in between the word lines 22 and in between the first insulating films 32, a third insulating film 46 composed of a silicon nitride film is provided. With reference to FIGS. 14B and 14C, over the bit line 12, provided is a fourth insulating film 48 composed of a silicon nitride film, with the tunnel insulating film 14 therebetween, having a U-shaped cross-sectional shape and extending in the extending direction of the bit line 12. The third insulating film 46 and the fourth insulating film 48 are adjoining to each other, and the adjoining surfaces of the third insulating film 46 and the fourth insulating film 48 are being disposed above the side surface of the bit line 12. The third insulating film 46 and the fourth insulating film 48 form the second insulating film 30. Other structures are the same as those of the first embodiment and shown in FIGS. 2A to 2E, thus the description thereof are omitted.

In a method for manufacturing the flash memory of the fourth embodiment, first, the same processes as described with reference to FIGS. 3A to 6E of the first embodiment are carried out to form the fourth insulating film 48 over the bit line 12 having the U-shaped cross-sectional shape and extending in the extending direction of the bit line 12. Thereafter, the same processes as described with reference to FIGS. 13A to 13E of the third embodiment are carried out to form the third insulating film 46 on the ONO film 20 in between the word lines 22 and in between the first insulating films 32. Then, the interlayer insulating film 24, the contact plug 28, the wiring layer 42 and the protection film 44 are formed to complete the flash memory of the fourth embodiment.

According to the fourth embodiment, as shown in FIGS. 14B and 14C, the third insulating film 46 is provided on the ONO film 20 in between the word lines 22 and in between the first insulating films 32, and the fourth insulating film 48 is provided over the bit line 12 having the U-shaped cross-sectional shape and extending in the extending direction of the bit line 12. Further, the first insulating film 32 is provided so as to be embedded in the fourth insulating film 48 of the U-shaped cross-sectional shape. Consequently, even when the position of the contact hole 26 is being formed displaced, the contact plug 28 can be prevented from contacting with the semiconductor substrate 10.

In particular, in the third embodiment, the side surface of the second insulating film 30 formed in between the first insulating films 32 is disposed above the side surface of the bit line 12. Therefore, when the position of the contact hole 26 is formed displaced, the contact plug 28 may make contact with the semiconductor substrate 10 in lateral to the bit line 12, i.e. area marked X shown in FIG. 11B. However, according to the fourth embodiment, the third insulating film 46 is provided in between the first insulating films 32, the fourth insulating film 48 is provided over the bit line 12, the third insulating film 46 and the fourth insulating film 48 are adjoining to each other, and the adjoining surfaces are disposed above the side surface of the bit line 12. Consequently, even when the position of the contact hole 26 is formed displaced, the contact plug 28 can be prevented from contacting the semiconductor substrate 10 laterally to the bit line 12.

While the fourth embodiment illustrates the third insulating film 46 being provided on the entire surface of the ONO film 20 in between the word lines 22 and in between the first insulating films 32, and the fourth insulating film 48 being provided over the bit line 12 having the U-shaped cross-sectional shape, it is not limited as such. For example, as shown in FIGS. 15A and 15B of a first modification example of the fourth embodiment, while the third insulating film 46 is provided on the entire surface of the ONO film 20 in between the word lines 22 and in between the first insulating films 32, the fourth insulating film 48 may be provided over the bit line 12 to extend in the extending direction of the bit line 12 and on the side surface of the third insulating film 46. Further, for example, in a second modification example of the fourth embodiment as shown in FIGS. 16A and 16B, while the fourth insulating film 48 is provided over the bit line 12 having the U-shaped cross-sectional shape and extending in the extending direction of the bit line 12, the third insulating film 46 may be provided on the ONO film 20 in between the word lines 22 and between the first insulating films 32 and on the side surface of the fourth insulating film 48. In those cases, even when the position of the contact hole 26 is formed displaced, the contact plug 28 can be prevented from contacting the semiconductor substrate 10 laterally to the bit line 12.

Furthermore, in the fourth embodiment, as in the second embodiment, the bit line 12 can be formed after the fourth insulating film 48 is formed in between the first conductive layers 36, thereby lowering the resistance of the bit line 12, reducing the number of manufacturing processes, and extending the channel length. Finally, several aspects of the present invention are summarized below.

According to an aspect of the present invention, there is provided a semiconductor device having a bit line provided to extend in a semiconductor substrate, a charge storage layer provided on the semiconductor substrate, a word line provided above the charge storage layer and to extend crossing the bit line, a gate electrode provided on the charge storage layer under the word line and between the bit lines, a first insulating film provided over the bit line and to extend in an extending direction of the bit line, a second insulating film composed of a different material from that of the first insulating film and provided to adjoin to a side surface of the first insulating film, an interlayer insulating film composed of a different material from that of the second insulating film and provided on the first insulating film and the second insulating film, and a contact plug coupled with the bit line and provided to penetrate through the first insulating film and the interlayer insulating film and to be sandwiched by the second insulating film. With this structure, even when the position of the contact hole is formed displaced, the contact plug can be prevented from contacting with the semiconductor substrate.

In the embodiments described above, the second insulating film may be provided over the bit line to extend in an extending direction of the bit line. Furthermore, in the structure mentioned above, the second insulating film may have a U-shaped cross-sectional shape, the first insulating film may be provided so as to be embedded in the second insulating film of the U-shaped cross-sectional shape, and the contact plug may be provided so as to penetrate through a bottom surface of the second insulating film of the U-shaped cross-sectional shape.

In the embodiments described above, the second insulating film may be provided on the charge storage layer in between the word lines and in between the first insulating films. According to this structure, even when the position of the contact hole is being formed more largely displaced, the contact plug can be prevented from contacting with the semiconductor substrate.

In the embodiments described above, the second insulating film may have a side surface thereof disposed above a side surface of the bit line. In the embodiments described above, the second insulating film may be composed of a third insulating film provided on the charge storage layer in between the word lines and in between the first insulating films and a fourth insulating film provided over the bit line to extend in an extending direction of the bit line and to adjoin to a side surface of the third insulating film. According to this embodiment, even when the position of the contact hole is being formed displaced, the contact plug can be further prevented from contacting with the semiconductor substrate.

In the embodiments described above, the fourth insulating film may have a U-shaped cross-sectional shape, the first insulating film may be provided so as to be embedded in the fourth insulating film of the U-shaped cross-sectional shape, and the contact plug may be provided so as to penetrate through a bottom surface of the fourth insulating film of the U-shaped cross-sectional shape. According to this structure, even when the position of the contact hole is being formed displaced, the contact plug can be further prevented from contacting with the semiconductor substrate.

In the embodiments described above, the adjoining surfaces of the third insulating film and the fourth insulating film may be disposed above the side surface of the bit line. Further, in the structure mentioned above, an upper surface of the gate electrode, an upper surface of the first insulating film, and an upper surface of the second insulating film may be planar. Furthermore, in the embodiments described above, the first insulating film and the interlayer insulating film may be composed of silicon oxide films, and the second insulating film may be composed of a silicon nitride film.

According to another aspect of the present invention, there is provided a method for manufacturing a semiconductor device having steps of forming a charge storage layer on a semiconductor substrate, forming a first conductive layer extending on the charge storage layer, forming a bit line in the semiconductor substrate with the first conductive layer as a mask, forming a first insulating film so as to be embedded in between the first conductive layers, forming a second conductive layer on the first conductive layer and the first insulating film, forming a word line by etching the second conductive layer with a mask layer formed to extend crossing the bit line on the second conductive layer as a mask, forming a gate electrode by etching the first conductive layer with the mask layer as a mask, forming a second insulating film composed of a different material from that of the first insulating film so as to adjoin to a side surface of the first insulating film, forming an interlayer insulating film composed of a different material from that of the second insulating film on the first insulating film and the second insulating film, forming a contact hole penetrating through the interlayer insulating film and the first insulating film and being sandwiched by the second insulating film, and forming a contact plug coupled with the bit line so as to be embedded in the contact hole. With this structure, even when the position of the contact hole is being formed displaced, the contact plug can be prevented from contacting with the semiconductor substrate.

In embodiments described above, the second insulating film may be composed of a material harder to etch than those of the first insulating film and the interlayer insulating film in the forming of the contact hole. In the embodiments described above, the forming of the second insulating film may include forming the second insulating film on a side surface of the first conductive layer prior to the forming of the first insulating film. According to this embodiment, the second insulating film can be formed over the bit line to extend in an extending direction of the bit line and to adjoin to the side surface of the first insulating film.

In the embodiments described above, the forming of the second insulating film may include forming the second insulating film along in between the first conductive layers, and the forming of the contact hole may include forming the contact hole so as to penetrate through the second insulating film. According to this structure, the second insulating film having a U-shaped cross-sectional shape can be formed. In the structure mentioned above, the forming of the bit line may be carried out after the forming of the second insulating film. According to this embodiment, lowering the resistivity of the bit line, reduction in number of manufacturing processes and extension of a channel length can be achieved.

In the embodiments described above, the forming of the second insulating film may include forming the second insulating film on the charge storage layer in between the word lines and in between the first insulating films after etching the first conductive layer and the second conductive layer. According to this structure, even when the position of the contact hole is being formed largely displaced, the contact plug can be prevented from contacting with the semiconductor substrate.

In the embodiments described above, the forming of the second insulating film may include forming a fourth insulating film on a side surface of the first conductive layer prior to the forming of the first insulating film and forming a third insulating film on the charge storage layer in between the word lines and in between the first insulating films so as to adjoin to a side surface of the fourth insulating film after etching the first conductive layer and the second conductive layer. According to this embodiment, even when the position of the contact hole is formed displaced, the contact plug can be further prevented from contacting with the semiconductor substrate.

In the embodiment described above, the forming of the fourth insulating film may include forming the fourth insulating film along in between the first conductive layers, and the forming of the contact hole may include forming the contact hole so as to penetrate through the fourth insulating film. According to this embodiment, even when the position of the contact hole is being formed displaced, the contact plug can be further prevented from contacting with the semiconductor substrate.

In the embodiment described above, the forming of the bit line may be carried out after the forming of the fourth insulating film. According to this structure, lowering the resistivity of the bit line, reduction in number of manufacturing processes and extension of a channel length can be achieved. In the structure mentioned above, the first insulating film and the interlayer insulating film may be composed of silicon oxide films, and the second insulating film may be composed of a silicon nitride film.

With reference to exemplary embodiments thereof, a semiconductor device is disclosed. The semiconductor device includes a bit line formed to extend into a semiconductor substrate, a charge storage layer formed on the semiconductor substrate, a word line formed above the charge storage layer to extend across the bit line, a gate electrode formed on the charge storage layer under the word line and between bit lines, a first insulating film formed over the bit line and to extend in the direction of the bit line and a second insulating film that includes a different material than that of the first insulating film and formed to adjoin a side surface of the first insulating film. In addition, the semiconductor device includes an interlayer insulating film that includes a different material from that of the second insulating film that is formed on the first insulating film and the second insulating film and a contact plug coupled to the bit line and formed to penetrate through the first insulating film and the interlayer insulating film and to be sandwiched by the second insulating film.

According to another aspect of the present invention, there is provided a method for manufacturing a semiconductor device having steps of forming a charge storage layer on a semiconductor substrate, forming a first conductive layer extending on the charge storage layer, forming a bit line in the semiconductor substrate with the first conductive layer as a mask, forming a first insulating film so as to be embedded in between the first conductive layers, forming a second conductive layer on the first conductive layer and the first insulating film, forming a word line by etching the second conductive layer with a mask layer formed to extend crossing the bit line on the second conductive layer as a mask, forming a gate electrode by etching the first conductive layer with the mask layer as a mask, forming a second insulating film composed of a different material from that of the first insulating film so as to adjoin to a side surface of the first insulating film, forming an interlayer insulating film composed of a different material from that of the second insulating film on the first insulating film and the second insulating film, forming a contact hole penetrating through the interlayer insulating film and the first insulating film and being sandwiched by the second insulating film, and forming a contact plug coupled with the bit line so as to be embedded in the contact hole.

The foregoing descriptions of specific embodiments have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

The invention claimed is:

1. A semiconductor device comprising:
a bit line formed to extend into a semiconductor substrate;
a charge storage layer formed on the semiconductor substrate;
a word line formed above the charge storage layer and to extend across the bit line;
a gate electrode formed on the charge storage layer under the word line and between bit lines;
a first insulating film formed over the bit line to extend in the direction of the bit line;
a second insulating film comprising a different material than that of the first insulating film and formed to adjoin a side surface of the first insulating film;
an interlayer insulating film comprising a different material from that of the second insulating film and formed on the first insulating film and the second insulating film; and
a contact plug coupled to the bit line and formed to penetrate through the first insulating film and the interlayer insulating film and to be sandwiched by the second insulating film.

2. The semiconductor device according to claim 1, wherein
the second insulating film has a U-shaped cross-sectional shape and is provided over the bit line to extend in a direction of the bit line,
the first insulating film is provided so as to be embedded in the second insulating film of the U-shaped cross-sectional shape, and
the contact plug is provided so as to penetrate through a bottom surface of the second insulating film of the U-shaped cross-sectional shape.

3. The semiconductor device according to claim 1, wherein the second insulating film is provided on the charge storage layer in between the word lines and in between the first insulating films.

4. The semiconductor device according to claim 1, wherein the second insulating film comprises:
a third insulating film provided on the charge storage layer in between the word lines and in between the first insulating films; and
a fourth insulating film provided over the bit line to extend in a direction of the bit line, having a U-shaped cross-sectional shape and adjoining a side surface of the third insulating film, and wherein
the first insulating film is embedded in the fourth insulating film of the U-shaped cross-sectional shape, and
the contact plug penetrates a bottom surface of the fourth insulating film of the U-shaped cross-sectional shape.

5. The semiconductor device according to claim 1 wherein the second insulating film comprises a material harder to etch than those of the first insulating film and the interlayer insulating film.

6. The semiconductor device according to claim 1 wherein the second insulating film is formed on a side surface of the first conductive layer prior to the forming of the first insulating film.

7. The semiconductor device according to claim 1 wherein the second insulating film is formed over the bit line to extend in a direction of the bit line and to adjoin the side surface of the first insulating film.

8. The semiconductor device according to claim 1 wherein the second insulating film is formed between the first conductive layers and comprises a contact hole formed to penetrate the second insulating film.

9. A flash memory device, comprising:
a data input component;
a data output component; and
a plurality of charge storage components, comprising:
a bit line provided to extend into a semiconductor substrate;
a charge storage layer provided on the semiconductor substrate;
a word line provided above the charge storage layer to extend across the bit line;
a gate electrode provided on the charge storage layer under the word line and in between the bit lines;

a first insulating film provided over the bit line to extend in a direction of the bit line;
a second insulating film composed of a different material from that of the first insulating film and provided to adjoin a side surface of the first insulating film;
an interlayer insulating film composed of a different material from that of the second insulating film and provided on the first insulating film and the second insulating film; and
a contact plug coupled with the bit line and provided to penetrate the first insulating film and the interlayer insulating film and to be sandwiched by the second insulating film.

10. The flash memory device according to claim 9, wherein the second insulating film has a U-shaped cross-sectional shape and is provided over the bit line to extend in a direction of the bit line,
the first insulating film is embedded in the second insulating film of the U-shaped cross-sectional shape, and
the contact plug penetrates a bottom surface of the second insulating film of the U-shaped cross-sectional shape.

11. The flash memory device according to claim 9, wherein the second insulating film is provided on the charge storage layer in between the word lines and in between the first insulating films.

12. The flash memory device according to claim 9, wherein the second insulating film comprises:
    a third insulating film provided on the charge storage layer in between the word lines and in between the first insulating films; and
    a fourth insulating film provided over the bit line to extend in a direction of the bit line, having a U-shaped cross-sectional shape and adjoining a side surface of the third insulating film, and wherein
the first insulating film is embedded in the fourth insulating film of the U-shaped cross-sectional shape, and
the contact plug is provided to penetrate a bottom surface of the fourth insulating film of the U-shaped cross-sectional shape.

13. The flash memory device according to claim 9 wherein the second insulating film comprises a material harder to etch than those of the first insulating film and the interlayer insulating film.

14. The flash memory device according to claim 9 wherein the second insulating film is formed on a side surface of the first conductive layer prior to the forming of the first insulating film.

15. A method for manufacturing a semiconductor device, the method comprising:
    forming a charge storage layer on a semiconductor substrate;
    forming a first conductive layer on the charge storage layer;
    forming a bit line in the semiconductor substrate using the first conductive layer as a mask;
    forming a first insulating film that is embedded in between the first conductive layers;
    forming a second conductive layer on the first conductive layer and the first insulating film;
    forming a word line by etching the second conductive layer with a mask layer to extend across the bit line on the second conductive layer as a mask;
    forming a gate electrode by etching the first conductive layer with the mask layer as a mask;
    forming a second insulating film composed of a different material from that of the first insulating film to adjoin a side surface of the first insulating film;
    forming an interlayer insulating film composed of a different material from that of the second insulating film on the first insulating film and the second insulating film;
    forming a contact hole that penetrates the interlayer insulating film and the first insulating film and is sandwiched by the second insulating film; and
    forming a contact plug that is coupled with the bit line so as to be embedded in the contact hole.

16. The method for manufacturing a semiconductor device according to claim 15, wherein the second insulating film is composed of a material that is harder to etch than those of the first insulating film and the interlayer insulating film in the forming of the contact hole.

17. The method for manufacturing a semiconductor device according to claim 15, wherein
    the forming of the second insulating film comprises forming the second insulating film between the first conductive layers prior to the forming of the first insulating film, and the forming of the contact hole comprises forming the contact hole to penetrate the second insulating film.

18. The method for manufacturing a semiconductor device according to claim 17, wherein the forming of the bit line is carried out after the forming of the second insulating film.

19. The method for manufacturing a semiconductor device according to claim 15, wherein the forming of the second insulating film comprises forming the second insulating film on the charge storage layer in between the word lines and in between the first insulating films after etching the first conductive layer and the second conductive layer.

20. The method for manufacturing a semiconductor device according to claim 15, wherein
    the forming of the second insulating film comprises:
        forming a fourth insulating film between the first conductive layers prior to the forming of the first insulating film, and
        forming a third insulating film on the charge storage layer between the word lines between the first insulating films to adjoin a side surface of the fourth insulating film after etching the first conductive layer and the second conductive layer; and
    the forming of the contact hole comprises forming the contact hole to penetrate the fourth insulating film.

* * * * *